United States Patent
Hurwitz

(10) Patent No.: US 9,754,814 B2
(45) Date of Patent: Sep. 5, 2017

(54) INTEGRATED PASSIVE DEVICE HAVING IMPROVED LINEARITY AND ISOLATION

(71) Applicant: Newport Fab, LLC, Newport Beach, CA (US)

(72) Inventor: Paul D. Hurwitz, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 14/165,868

(22) Filed: Jan. 28, 2014

(65) Prior Publication Data
US 2014/0252535 A1 Sep. 11, 2014

Related U.S. Application Data

(60) Provisional application No. 61/775,426, filed on Mar. 8, 2013.

(51) Int. Cl.
| | | |
|---|---|---|
| *H01L 21/762* | (2006.01) | |
| *H01L 29/06* | (2006.01) | |
| *H01L 49/02* | (2006.01) | |
| *H01L 27/01* | (2006.01) | |

(52) U.S. Cl.
CPC .......... *H01L 21/762* (2013.01); *H01L 27/016* (2013.01)

(58) Field of Classification Search
CPC .......... H01L 28/00; H01L 24/11; H01L 29/064
USPC .......................................... 257/506; 438/381
See application file for complete search history.

(56) References Cited

U.S. PATENT DOCUMENTS

| | | | | |
|---|---|---|---|---|
| 4,642,880 | A * | 2/1987 | Mizutani | H01L 29/7885 148/DIG. 82 |
| 6,693,297 | B2 * | 2/2004 | Tsujimura | H01L 27/12 257/347 |
| 6,713,819 | B1 * | 3/2004 | En | H01L 21/84 257/131 |
| 7,868,419 | B1 * | 1/2011 | Kerr et al. | 257/531 |
| 8,076,750 | B1 * | 12/2011 | Kerr et al. | 257/528 |
| 8,536,021 | B2 * | 9/2013 | Arriagada | H01L 21/02365 438/455 |
| 2006/0197182 | A1 * | 9/2006 | Degani et al. | 257/531 |
| 2006/0249795 | A1 * | 11/2006 | Chen | H01L 21/823814 257/371 |
| 2007/0120195 | A1 * | 5/2007 | Sheraw | H01L 27/0629 257/369 |
| 2009/0170254 | A1 * | 7/2009 | Rhee | H01L 21/26506 438/199 |

(Continued)

*Primary Examiner* — Moazzam Hossain
(74) *Attorney, Agent, or Firm* — Farjami & Farjami LLP

(57) ABSTRACT

Disclosed is a structure for improved electrical signal isolation in a semiconductor substrate between integrated passive devices (IPDs) and an associated method for the structure's fabrication. The structure includes an amorphized region in the semiconductor substrate, a dielectric layer formed over the amorphized region, and IPDs formed over the dielectric layer. The amorphized region is not recrystallized and may be formed by utilizing an inert implant that does not charge-dope the amorphized region, while forming a plurality of charge carrier traps at an interface between the amorphized region and the dielectric layer to prevent a parasitic conduction layer from forming at the interface. The inert implant may include one of Argon, Xenon and Germanium. In many implementations, the structure does not include an active device.

5 Claims, 4 Drawing Sheets

(56) References Cited

U.S. PATENT DOCUMENTS

| | | | |
|---|---|---|---|
| 2010/0035403 A1* | 2/2010 | Brown | H01L 21/76224 438/422 |
| 2010/0052053 A1* | 3/2010 | Barth et al. | 257/347 |
| 2011/0079876 A1* | 4/2011 | Hose | H01L 23/5223 257/531 |
| 2011/0127529 A1* | 6/2011 | Botula et al. | 257/49 |
| 2012/0025345 A1* | 2/2012 | Botula et al. | 257/503 |
| 2014/0001635 A1* | 1/2014 | Chen et al. | 257/751 |

* cited by examiner

INTEGRATED PASSIVE DEVICE HAVING IMPROVED LINEARITY AND ISOLATION

The present application claims the benefit of and priority to a provisional patent application titled "Integrated Passive Device Having Improved Linearity and Isolation", Ser. No. 61/775,426, filed on Mar. 8, 2013. The disclosure in this provisional application is hereby incorporated fully by reference into the present application.

BACKGROUND

As semiconductor design continues to advance, radio frequency (RF) functional blocks are increasingly being fabricated utilizing integrated passive device (IPD) technology in which passive components, such as resistors, capacitors, inductors, couplers, transformers and/or antennas, for example, are fabricated over a dielectric layer formed on a substrate. Because silicon substrates are extensively used in the integrated circuit (IC) industry, there are substantial cost advantages to implementing IPD processes on silicon. However, the relatively low resistivity of bulk silicon substrates introduces undesirable RF losses through coupling paths within the substrate.

A conventional method of controlling such RF losses uses an insulating layer to isolate the substrate from the signal-carrying conductive layers. Unfortunately, the use of such insulating layers results in charge accumulation at the interface between the silicon substrate and the overlying insulating layer. This charge accumulation forms a parasitic conduction layer (PCL) at the interface. The performance of the IPD is compromised by a parasitic coupling between the relatively low resistivity PCL and overlying conductors. This performance degradation may take the form of increased power loss through the IPD or decreased linearity of the IPD itself.

One method of avoiding formation of the PCL is by using a fully insulating substrate, such as quartz or sapphire. However, quartz and sapphire substrates are considerably more expensive than bulk silicon substrates and are not easily integrated into silicon manufacturing. Silicon-on-insulator (SOI) technologies having a trap-rich layer under the base oxide may also be utilized to mitigate the PCL. However, SOI wafers are also considerably more expensive than bulk silicon substrates.

SUMMARY

The present disclosure is directed to integrated passive devices having improved linearity and isolation, substantially as shown in and/or described in connection with at least one of the figures, and as set forth more completely in the claims.

DETAILED DESCRIPTION

Figure 1:
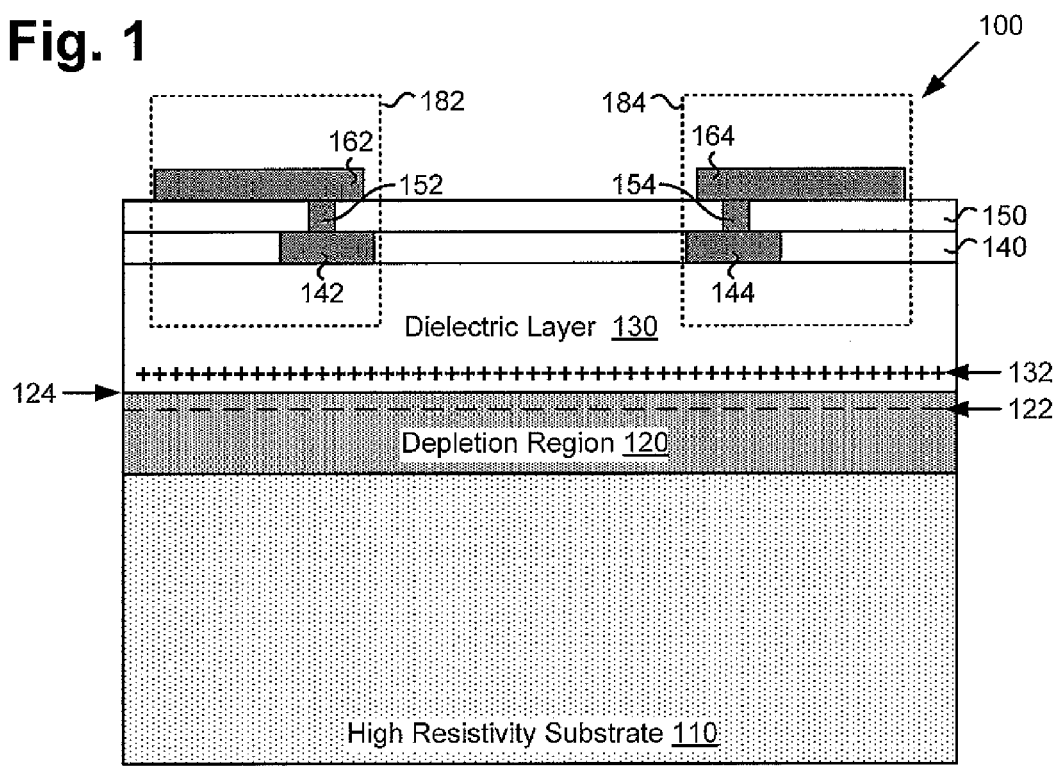
FIG. 1 presents an exemplary diagram showing a cross-section of a conventional IPD structure having a PCL.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The present inventive concepts utilize an inert implant to create a layer of disordered or amorphized silicon at the surface of a bulk high resistivity silicon wafer to provide a region of high carrier trap density. The high carrier trap density provides a much higher resistivity than a PCL, which allows fabrication of higher performance IPDs by providing a substrate that performs much closer to the ideal high resistivity silicon. The advantages of the present inventive concepts include reduced RF loss through the substrate, improved linearity, and higher isolation between IPDs and the substrate.

FIG. 1 presents an exemplary diagram disclosing a cross-section of a conventional IPD structure having a PCL. IPD structure 100 includes high resistivity substrate 110. High resistivity substrate 110 may be a high resistivity silicon substrate and may have a resistivity of approximately 1000 ohms-cm. However, high resistivity substrate 110 is not so limited and may have a resistivity greater than or less than this value. Dielectric layer 130 may be formed on high resistivity substrate 110. Conductive layer 142 and conductive layer 144 may be formed in dielectric layer 140, which is formed on dielectric layer 130. Conductive via 152 and conductive via 154 may be formed in dielectric layer 150, which is formed on dielectric layer 140. Conductive vias 152 and 154 may be physically and electrically connected to conductive layers 142 and 144, respectively. Finally, conductive layer 162 and conductive layer 164 may be formed over dielectric layer 150 and may be electrically and physically connected to conductive vias 152 and 154, respectively. Thus, conductive layers 142 and 162 along with conductive via 152 may form first IPD 182, while conductive layers 144 and 164 along with conductive via 154 may form second IPD 184. However, each of first IPD 182 and second IPD 184 may include more or fewer conductive layers and/or conductive vias in the same or different orientations, depending on the particular passive device or devices each IPD forms. For example, IPDs 182 and/or 184 may be a part of capacitors, inductors, resistors, transformers, antennas or any other passive devices.

As shown in FIG. 1, formation of dielectric layer 130 directly on high resistivity substrate 110 results in an accumulation of fixed charges 132 in dielectric layer 130 near interface 124 between high resistivity substrate 110 and dielectric layer 130. As a result, free charge carriers, typically electrons, are pulled from high resistivity substrate 110 to interface 124 to balance out fixed charges 132. Thus, PCL 122 is formed at or near interface 124 in high resistivity substrate 110. Because the free charge carriers are pulled locally from high resistivity substrate 110, depletion region 120 forms at the top of high resistivity substrate 110.

The relatively high mobility of electrons in PCL 122 artificially lowers the resistivity of high resistivity substrate 110 and creates an undesirable parasitic coupling between each of IPDs 182 and 184 and high resistivity substrate 110. Because the thickness of depletion region 120 in FIG. 1 is nonlinearly dependent upon the potential at one or both of IPD 182 and IPD 184, undesirable nonlinear harmonics of a signal applied to IPD 182 and/or IPD 184 may be induced in high resistivity substrate 110.

Figure 2:
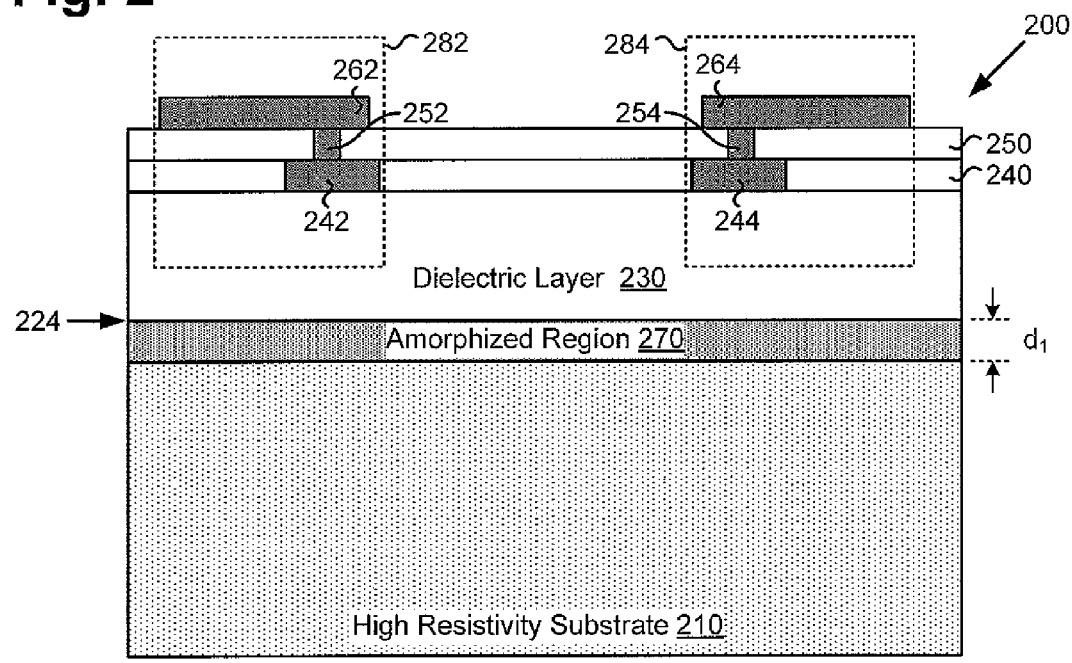
FIG. 2 presents an exemplary cross-sectional diagram of an IPD structure having improved linearity and isolation, in accordance with an implementation of the present application.

FIG. 2 presents an exemplary cross-sectional diagram of an IPD structure having improved linearity and isolation, in accordance with an implementation of the present application. FIG. 2 discloses IPD structure 200, including high resistivity substrate 210. High resistivity substrate 210 may be a high resistivity semiconductor substrate, and more specifically, a high resistivity silicon substrate. High resistivity substrate 210 may have a resistivity of approximately 1000 ohms-cm. However, high resistivity substrate 210 is not so limited and may have a resistivity greater than or less than this value. Dielectric layer 230 may be formed on high resistivity substrate 210. Conductive layer 242 and conductive layer 244 may be formed in dielectric layer 240, which is formed on dielectric layer 230. Conductive via 252 and conductive via 254 may be formed in dielectric layer 250, which is formed on dielectric layer 240. Conductive vias 252 and 254 may be physically and electrically connected to conductive layers 242 and 244, respectively. Finally, conductive layer 262 and conductive layer 264 may be formed over dielectric layer 250 and may be electrically and physically connected to conductive vias 252 and 254, respectively. As shown in FIG. 2, conductive layers 242 and 262 along with conductive via 252 may form first IPD 282, while conductive layers 244 and 264 along with conductive via 254 may form second IPD 284. However, first IPD 282 and second IPD 284 may include more or fewer conductive layers and/or conductive vias in the same or different orientations, according to the particular passive device or devices each IPD forms. For example, IPDs 282 and/or 284 may be one of capacitors, inductors, resistors, transformers, antennas or any other passive devices.

As shown in FIG. 2, the present inventive concepts introduce an inert implant to the top surface of high resistivity substrate 210 that does not charge-dope the top surface. Such an inert implant may include Argon, Xenon, Germanium, or any other appropriate element that will not modify the charge doping of the substrate. Amorphized region 270 may have a thickness $d_1$ of approximately 1 µm. However, amorphized region 270 may have any appropriate thickness according to the specific implementation. Amorphized region 270 may be formed before formation of dielectric layer 230.

This inert implant forms a high density of carrier traps in amorphized region 270, which artificially increase the resistivity of high resistivity substrate 210 by preventing the formation of a PCL. The high number of carrier traps at interface 224 substantially reduces the mobility of free carriers within high resistivity substrate 210. In addition, the Fermi potential at the top surface of high resistivity substrate 210 is pinned by the carrier traps such that depletion of the substrate of carriers will not be modulated by signals applied to the IPDs. Thus, high resistivity substrate 210 does not include a depletion region because the increased number of carrier traps at interface 224 prevents depletion of the underlying substrate. This is brought about because the lifetime of carriers immobilized in the carrier traps is very short. Thus, as the voltage at either of IPD 282 or IPD 284 is modulated, the carrier traps are populated very quickly with carriers responding to the potential gradient, rather than depleting the underlying silicon, which would occur if a PCL were formed.

Figure 3:
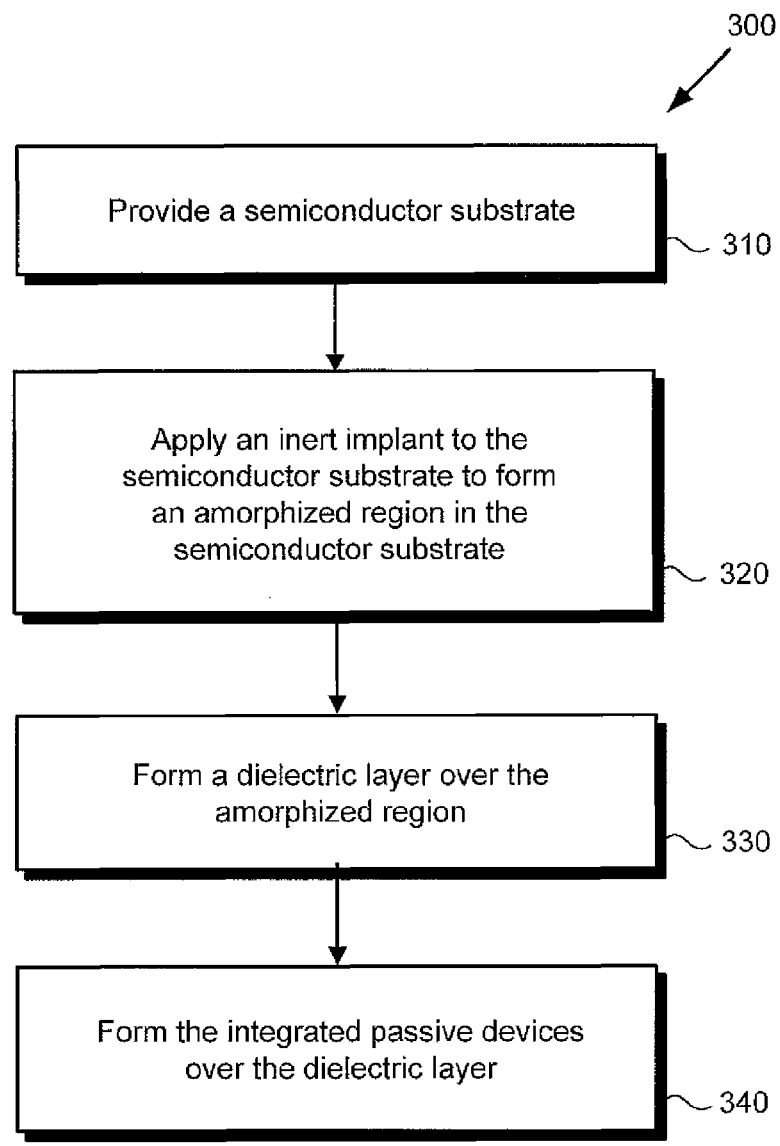
FIG. 3 presents a flowchart of a method for fabricating an IPD structure having improved linearity and isolation, in accordance with an implementation of the present application.

A method for fabricating an IPD structure having improved linearity and isolation will now be described with reference to FIG. 3. FIG. 3 presents a flowchart of a method for fabricating an IPD structure having improved linearity and isolation, in accordance with an implementation of the present application.

Figure 4A:
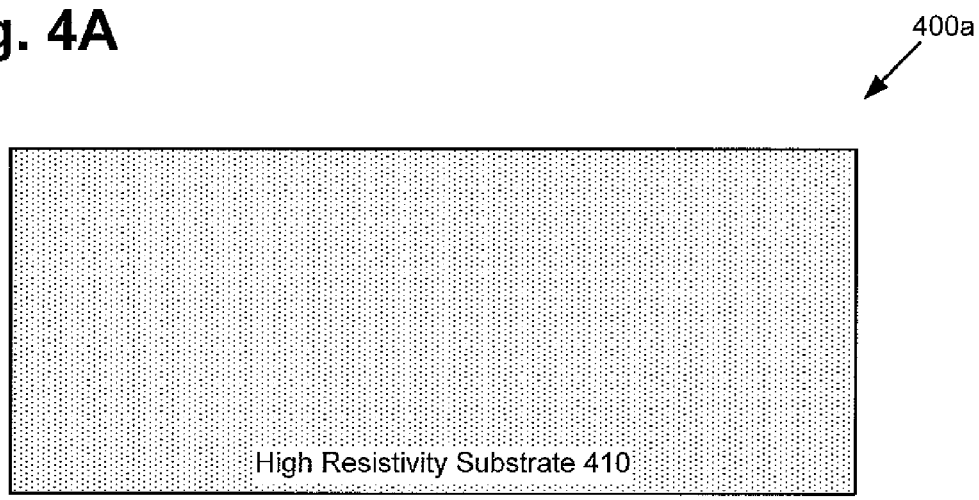
FIG. 4A illustrates a cross-sectional view of an initial stage in the fabrication of an IPD structure having improved linearity and isolation, in accordance with an implementation of the present application.

FIG. 3 shows flowchart 300 including actions 310, 320, 330 and 340. Flowchart 300 begins with action 310, which includes providing a semiconductor substrate. Cross-sectional view 400a of FIG. 4A may present the result of action 310. For example, FIG. 4A shows high resistivity substrate 410. High resistivity substrate 410 may be a high resistivity semiconductor substrate, and more specifically a high resistivity silicon substrate.

Figure 4B:
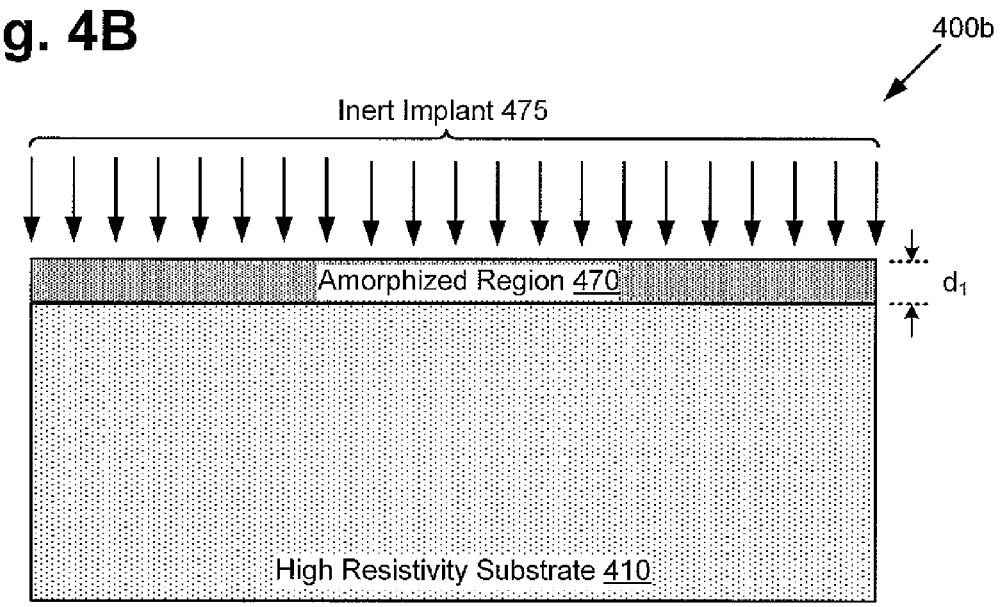
FIG. 4B illustrates another progressive cross-sectional view of an intermediate stage in fabrication of an IPD structure having improved linearity and isolation, in accordance with an implementation of the present application.

Flowchart 300 continues with action 320, which includes applying an inert implant to the semiconductor substrate to form an amorphized region in the semiconductor substrate. Cross-sectional view 400b of FIG. 4B may present the result of action 320 applied to FIG. 4A. For example, FIG. 4B shows inert implant 475 applied to a top surface of high resistivity substrate 410. Inert implant 475 forms amorphized region 470, having a thickness $d_1$ of approximately 1 µm. However, the thickness of amorphized region 470 may be greater than or less than this value, according to the specific application.

The inert implant may include ions that will not dope the silicon of the substrate. Examples may include Argon, Xenon, Germanium or any other appropriate element that will not modify the charge doping of the substrate. For Argon, an implant density of $10^{14}/cm^2$ at an implant power of a few hundred keV is sufficient to amorphize at least the top few thousand angstroms of silicon. Heavier implanted ions, such as Germanium or Xenon, may require a lower implant density. In the alternative, inert implant 475 may be performed through a thin screen oxide (not shown) to facilitate removal of any particles associated with the amorphizing process. Because inert implant 475 may be applied before formation of any overlying dielectric layer, inert implant 475 may be applied across the entire top surface of high resistivity substrate 410.

Figure 4C:
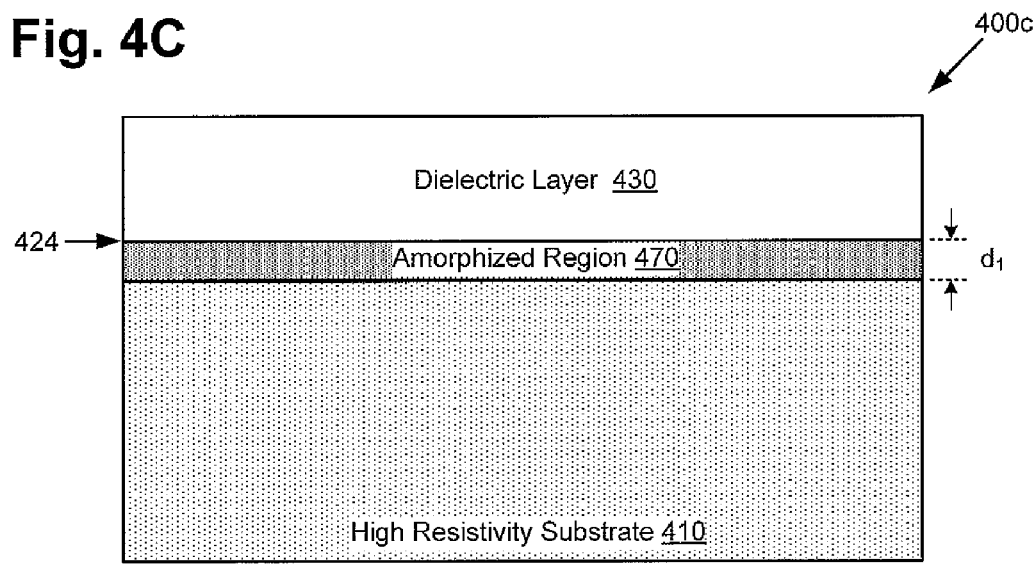
FIG. 4C illustrates another progressive cross-sectional view of an intermediate stage in the fabrication of an IPD structure having improved linearity and isolation, in accordance with an implementation of the present application.

Flowchart 300 continues with action 330, which includes forming a dielectric layer over the amorphized region. Cross-sectional view 400c of FIG. 4C may present the result of action 330 applied to FIG. 4B. For example, FIG. 4C shows dielectric layer 430 formed on amorphized region 470, which is situated in the top portion of high resistivity substrate 410. Because exposure to temperatures greater than about 525° C. will result in recrystallization of amorphized region 470, dielectric layer 430 may be formed utilizing plasma assisted techniques to keep processing temperatures low. However, in many implementations only passive components and no active devices are formed in the IPD structures, and the high annealing temperatures typically associated with active device region doping are unnecessary.

Figure 4D:
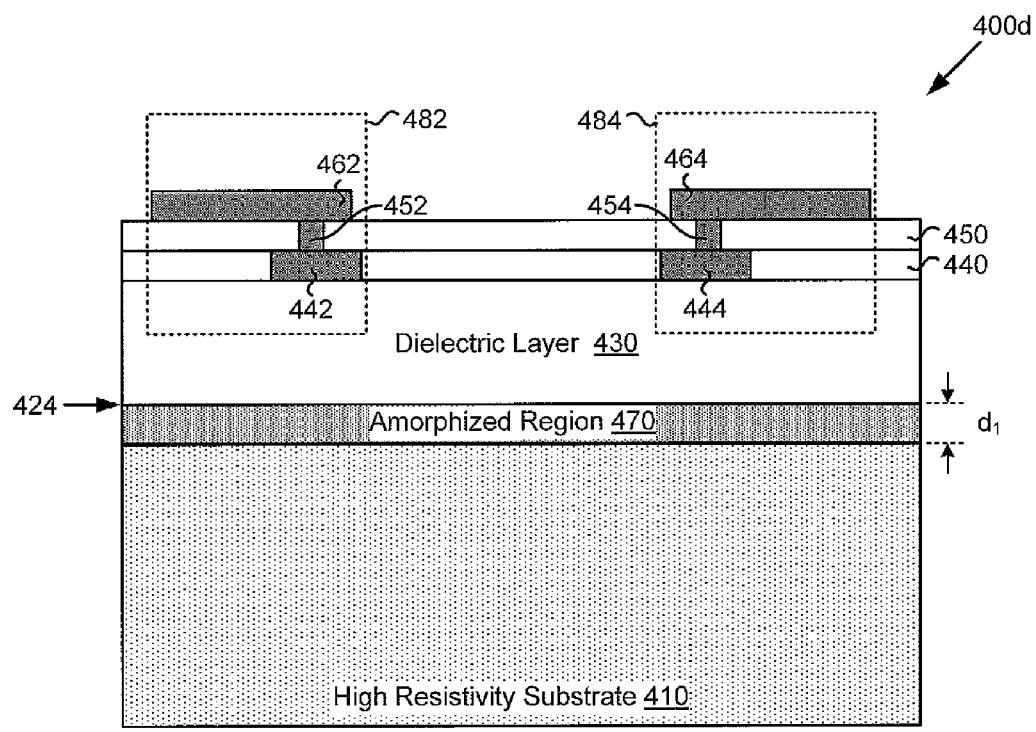
FIG. 4D illustrates another progressive cross-sectional view of a final stage in the fabrication of an IPD structure having improved linearity and isolation, in accordance with an implementation of the present application.

Flowchart 300 continues with action 340, which includes forming the integrated passive devices over the dielectric layer. Cross-sectional view 400d of FIG. 4D may present the result of action 340 applied to FIG. 4C. For example, FIG. 4D shows IPD 482 including conductive layers 442 and 462 and conductive via 452, and IPD 484 including conductive layers 444 and 464 and conductive via 454. IPDs 482 and 484 may be formed within and/or on dielectric layers 440 and 450 by any low temperature method known to those of ordinary skill in the art. For example, blanket deposition of a conductive metal followed by a patterned etch and dielectric fill may be utilized if conductive layers are aluminum based. In an alternative example, IPDs 482 and 484 may be formed by a subtractive damascene process if formed from copper.

Thus, the present inventive concepts utilize an amorphized region in a top surface of a high resistivity substrate to prevent formation of a PCL at an interface with an overlying dielectric layer. The advantages of the present inventive concepts include reduced RF loss through the substrate, improved linearity, and higher isolation between adjacent IPDs or between the IPDs and the substrate.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A structure for improved electrical signal isolation between radio frequency (RF) integrated passive devices (IPDs), said structure comprising:
   a non-recrystallized amorphized region in a semiconductor substrate that does not include an active device, such that said non-recrystallized amorphized region is not subject to high annealing temperatures associated with active device region doping;
   said non-recrystallized amorphized region having a substantially uniform thickness;
   a dielectric layer formed over said non-recrystallized amorphized region;
   said RF IPDs formed over said dielectric layer;
   a plurality of charge carrier traps at an interface between said non-recrystallized amorphized region and said dielectric layer, wherein a Fermi potential at a top surface of said substrate is pinned by said plurality of charge carrier traps such that depletion of said substrate of carriers will not be modulated by signals applied to said RF IPDs.

2. The structure of claim 1, wherein said semiconductor substrate is a high-resistivity silicon substrate.

3. The structure of claim 1, wherein said structure does not include a parasitic conduction layer at an interface between said amorphized region and said dielectric layer.

4. The structure of claim 1, wherein said IPDs comprise at least one conductive layer.

5. The structure of claim 4, wherein said IPDs further comprise at least one conductive via electrically connected to said at least one conductive layer.

* * * * *